United States Patent
Yu

Patent Number: 5,760,451
Date of Patent: Jun. 2, 1998

[54] RAISED SOURCE/DRAIN WITH SILICIDED CONTACTS FOR SEMICONDUCTOR DEVICES

[75] Inventor: Anthony J. Yu, Poughquag, N.Y.

[73] Assignee: International Business Machines Corporation, Armonk, N.Y.

[21] Appl. No.: 803,098

[22] Filed: Feb. 20, 1997

Related U.S. Application Data

[63] Continuation of Ser. No. 618,688, Mar. 21, 1996, abandoned, which is a continuation of Ser. No. 356,434, Dec. 15, 1994, abandoned, which is a division of Ser. No. 246,532, May 20, 1994, Pat. No. 5,409,853.

[51] Int. Cl.$^6$ .................................................. H01L 29/78
[52] U.S. Cl. .......................... 257/382; 257/383; 257/413; 257/755; 257/768
[58] Field of Search .................................. 257/382, 383, 257/384, 412, 413, 755, 757, 769, 768, 770

[56] References Cited

U.S. PATENT DOCUMENTS

| | | | |
|---|---|---|---|
| 3,923,559 | 12/1975 | Sinha | 257/288 |
| 4,016,587 | 4/1977 | De La Moneda | 257/387 |
| 4,072,545 | 2/1978 | De La Moneda | 148/187 |
| 4,419,810 | 12/1983 | Riseman | 29/571 |
| 4,682,409 | 7/1987 | Thomas et al. | 29/591 |
| 4,803,539 | 2/1989 | Psaras et al. | 257/769 |
| 4,885,617 | 12/1989 | Mazure-Espejo et al. | 257/381 |
| 4,929,992 | 5/1990 | Thomas et al. | 257/382 |
| 4,948,745 | 8/1990 | Pfiester et al. | 437/41 |
| 4,952,993 | 8/1990 | Okumura | 257/382 |
| 4,998,150 | 3/1991 | Rodder et al. | 257/288 |
| 5,027,185 | 6/1991 | Liauh | 257/384 |
| 5,079,180 | 1/1992 | Rodder et al. | 437/44 |
| 5,118,639 | 6/1992 | Roth et al. | 437/41 |
| 5,149,666 | 9/1992 | Mikata et al. | 438/300 |
| 5,168,072 | 12/1992 | Moslehi | 257/327 |
| 5,624,867 | 4/1997 | Cheng et al. | 438/560 |

FOREIGN PATENT DOCUMENTS

| | | | |
|---|---|---|---|
| 0245480 | 9/1992 | Japan | 257/384 |

OTHER PUBLICATIONS

J. Electrochem. Soc.: Solid–State Science and Technology, vol. 122, No. 12, "Kinetics of the Initial Stage of Si Transport Through Pd–Silicide for Epitaxial Growth" by Z.L. Liau, et al., pp. 1696–1700.

Journal of Applied Physics, vol. 46, No. 7, Jul. 1975, "Solid–Phase Epitaxial Growth of Si Through Palladium Silicide Layers" by C. Canali, et al., pp. 2831–2836.

Applied Physics Letters, vol. 28, No. 3, 1 Feb. 1976, "Antimony Doping of Si Layers Grown by Solid–Phase Epitaxy" by S.S. Lau, et al., pp. 148–150.

Poate, Tu, Mayer, "Thin Film—Interdiffusion and Reactions", Wiley and Sons, New York (1978), pp. 450–460.

*Primary Examiner*—David B. Hardy
*Attorney, Agent, or Firm*—Alison D. Mortinger

[57] ABSTRACT

A contact for a semiconductor device is provided by depositing a layer of palladium on a silicon substrate, causing the palladium to react with the substrate for forming palladium silicide, removing unreacted palladium from the substrate, forming doped silicon on the palladium silicide and substrate, causing the silicon to be transported through the palladium silicide for recrystallizing on the substrate for forming epitaxially recrystallized silicon regions on the substrate and lifting the palladium silicide above the epitaxially recrystallized silicon regions for forming a silicided contact therefor, and removing the doped silicon from the substrate.

13 Claims, 3 Drawing Sheets

RAISED SOURCE/DRAIN WITH SILICIDED CONTACTS FOR SEMICONDUCTOR DEVICES

This is a Continuation of application Ser. No. 08/618,688, filed Mar. 21, 1996, abandoned, which is a Continuation of application Ser. No. 08/356,434, filed Dec. 15, 1994, abandoned, which is a Division of application Ser. No. 08/246,532, filed May 20, 1994, now U.S. Pat. No. 5,409,853.

TECHNICAL FIELD

The present invention relates generally to semiconductor devices, and more particularly, to silicided contacts for semiconductor devices.

BACKGROUND OF THE INVENTION

As lithography allows for further scaling down of lateral dimensions in complementary metal oxide semiconductor (CMOS) devices, raised source and drain regions are being more commonly utilized to provide for a high performance transistor having ultra-shallow junctions. Raised source/drain regions, however, present a unique set of problems. For example, a physical facet is formed at the interfaces between the source/drain regions and the isolation field oxide of the transistor structure, and at the interfaces between the raised source/drain regions and the sidewall spacer adjacent to the gate conductor. Unfortunately, silicide contact can create a "spike" in these facets, and the spike may penetrate into the underlying substrate and through the shallow junction. Such a defect can lead to unwanted and detrimental device leakage.

The construction of transistors with raised source and drain regions demands highly controlled diffusion of dopants for creating the shallow junctions of the transistor. Current technology employs an ion implantation prior to deposition of the raised source and drain regions in order to form the electrical connection to the channel region of the device. However, the elevated temperatures inherent to the process of depositing the raised source and drain regions may cause the implanted dopant profile to further diffuse past the point of optimal device performance.

Further, the formation of silicided junctions can lead to problems when integrated with raised source and drain regions. When the gate conductor is not fully isolated from the raised source and drain regions, the silicided process can cause undesirable electrical contact between the gate and source and drain regions.

U.S. Pat. No. 4,998,150, issued Mar. 5, 1991, and U.S. Pat. No. 5,079,180, issued Jan. 7, 1992, both to Rodder and Chapman, disclose a raised "moat" region formed by epitaxial deposition. A thin sidewall insulator is used to allow lateral tailoring for the overlap capacitance while maintaining shallow transistor junctions. A second insulating spacer is used to separate the field insulating region and the raised source and drain regions. As a result, the tendency for silicide spike formation into the substrate is suppressed. Disadvantageously, the process disclosed requires scrupulous surface preparation and high temperature processing of epitaxial deposition. Further, a sidewall spacer is used to lengthen the distance between the raised source/drain regions and the top of the isolating gate. Deposition or growth of an epitaxial layer results in the formation of the raised source and drain regions. Rodder and Chapman acknowledges the drawbacks of high temperature processing, but unfortunately includes the associated anneal that causes unwanted diffusion of dopants within the substrate. Additionally, Rodder and Chapman limit the sidewall spacer thickness to 100–300 nm.

U.S. Pat. No. 5,118,639, issued Jun. 2, 1992, to Roth and Kirsch discloses forming elevated source and drain regions by depositing silicon onto prepared nucleation sites. These patterned sites allow the propagation of the selective deposition process. The end result of depositing such an electrically conductive material is a contact to the surface substrate with the gate electrode being isolated with insulating spacers and cap material. Roth and Kirsch assume the use of a high temperature selective polysilicon deposition, and suggest that the preparation of the nucleation site interface is marginal.

U.S. Pat. No. 4,072,545, issued Feb. 7, 1978, to De La Moneda discloses a decoupled source/drain fabrication from that of the contact. De La Moneda uses ion implantation for the contact and epitaxial deposition for the junctions. However, this patent requires the removal of gate oxide by wet etch, followed by the deposition of epitaxial silicon over the seed regions.

U.S. Pat. No. 4,948,745, issued Aug. 14, 1990, to Pfiester and Sivan discloses a process that uses the insulating cap over the gate electrode to pattern the gate. The cap is then removed to allow the second deposition of polysilicon. The second deposition of polysilicon extends laterally up onto the field oxide region. Pfiester and Sivan use sidewall spacers to isolate the elevated source/drain electrodes and the gate electrode. Again, such a structure is limited by the complexity of the growth of selective silicon.

Thus, there remains a need in semiconductor device technology for a reliable and manufacturable raised source/drain field effect structure.

OBJECTS OF THE INVENTION

An object of the present invention is to provide for an improved semiconductor device.

Another object of the present invention is to provide for a silicided contact for a semiconductor device.

Yet another object of the present invention is to provide for a reliably manufacturable semiconductor device having a gate electrode, and including raised source and drain regions.

Still another object of the invention is to provide for a semiconductor device having raised source and drain junctions that are substantially free of crystal defects.

A further object of the present invention is to provide for a semiconductor device which includes low resistance palladium silicide contacts to raised source and drain regions.

SUMMARY OF THE INVENTION

In order to accomplish the above and other objects of the present invention, a contact for a semiconductor device is provided by depositing a layer of palladium on a silicon substrate, causing the palladium to react with the substrate for forming palladium silicide, removing unreacted palladium from the substrate, depositing silicon on the palladium silicide and substrate, implanting the silicon with dopant, such that the palladium silicide blocks introduction of the dopant into the substrate, and causing the silicon to be transported through the palladium silicide for recrystallizing on the substrate for forming epitaxially recrystallized silicon regions on the substrate. The palladium silicide is lifted above the epitaxially recrystallized silicon regions for forming a silicided contact to highly doped silicon.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENT

Figure 1A:
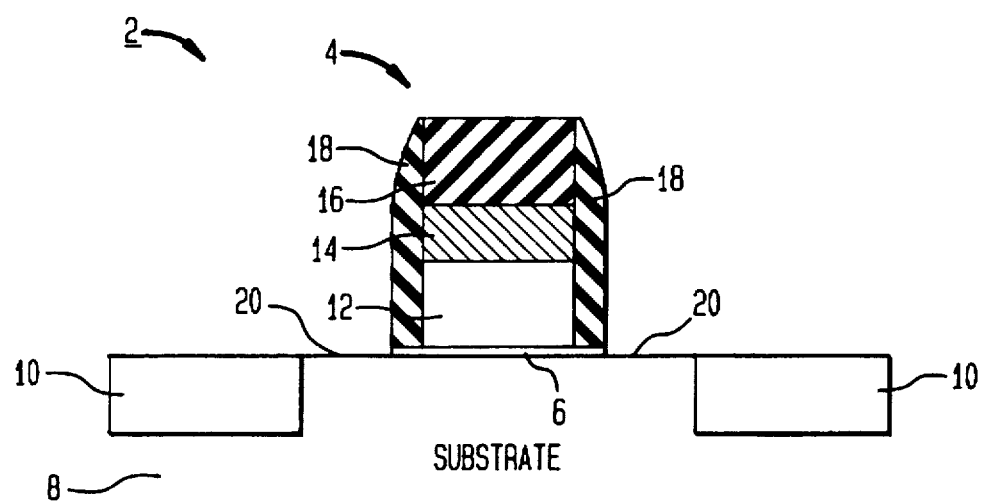
FIGS. 1A–F show process steps for fabricating a semiconductor device having raised source and drain regions with silicided contacts in accordance with the present invention.

Referring initially to FIG. 1A, a semiconductor device or, more specifically, a metal-oxide-semiconductor field-effect-transistor (MOSFET), 2 is shown. The semiconductor device 2 includes a silicided gate 4 comprising a gate oxide or insulating film 6 deposited on a semiconductor substrate 8, a polysilicon layer 12, a silicide layer 14 and a dielectric or insulating layer 16. Isolations 10 function to isolate or separate the device 2 from other devices, and may be, for example, shallow trench isolations. The silicided gate 4 and isolations 10 can be fabricated by conventional techniques. Generally, the thickness of the gate oxide film 6 may be approximately 5 nm, the thickness of the polysilicon layer 12 may be approximately 150 nm and can be n+ or p+ doped, and the thickness of the dielectric or insulating capping layer 16 may be approximately 200 nm. The silicide layer 14 can be comprised, for example, of a refractory metal, such as W, Ti, Ta, or a metal silicide, such as $TiSi_2$.

Sidewall spacers 18 are formed adjacent to the sidewall of the gate conductor, for example, by conventional low pressure chemical vapor deposition and etching of silicon nitride. As further explained hereinbelow, the thickness of the sidewall spacers 18 should be appropriate for preventing certain material from forming or growing onto the sides of the gate conductor, and for allowing proper junction formation. For example, appropriate thickness for the sidewall spacers 18 for certain applications can be approximately 20–30 nm.

In accordance with the invention, the active silicon junction surfaces 20 are then prepared for a palladium metal deposition. In this regard, such preparation may include a 40 second dip in 40:1 water:buffered HF, followed by a water rinse and isopropanol dry to remove any remaining gate oxide, photoresist and interfacial contaminant films.

Figure 1B:
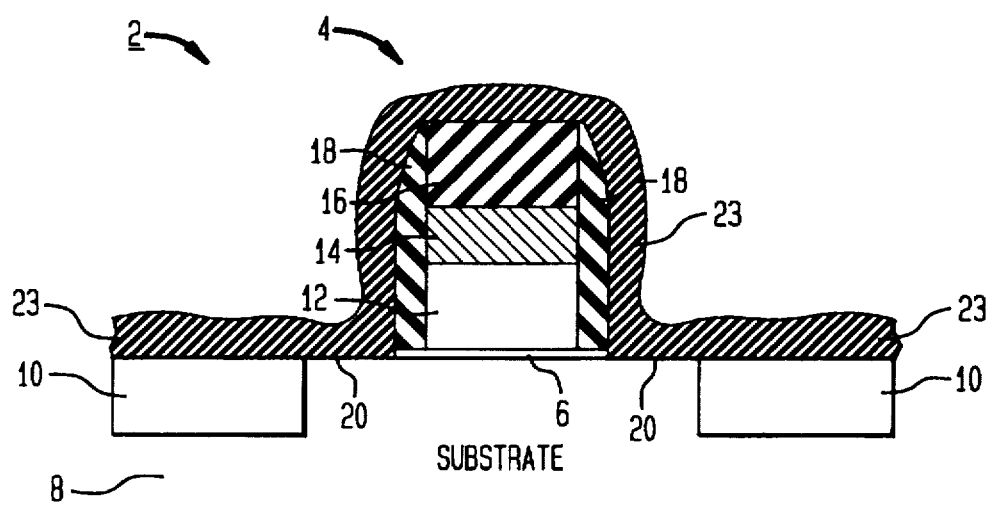

As shown in FIG. 1B, palladium 23 is then deposited on the device 2. For the aspect ratio associated with a 0.25 um CMOS process, an approximately 15 nm thick layer of palladium is required to be deposited. Sputtering is the preferred method for deposition of the palladium 23. Typical sputtering conditions may include approximately 600 watts of (DC) power in an argon gas, at a sputtering gas pressure on the order of approximately 6 mTorr. Under these conditions, a 15 nm palladium film will require approximately 20 seconds for deposition.

Figure 1C:
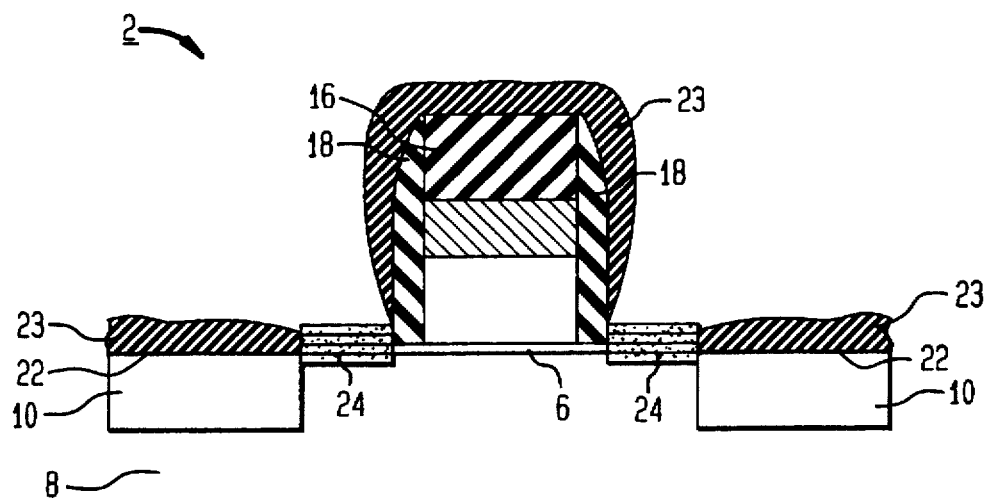

With reference now to FIG. 1C, the palladium 23 is then caused to react with the active silicon surfaces 20 to form metal-rich junction silicide 24, specifically, palladium silicide, on these surfaces 20. Note that the reaction causes a portion of the silicon substrate to be consumed as part of the palladium silicide 24, such that a portion of the palladium silicide 24 thus formed is positioned below the original surface of the silicon surfaces 20. As an example, a low temperature anneal (for e.g., 350° C.) in nitrogen for approximately 30 minutes will initiate the solid state reaction between the palladium and the active silicon. The palladium reacts with the active silicon surface 20 to form palladium silicide 24 on these surfaces 20, but the palladium 23 does not react with the sidewall spacers 18, capping layer 16, or field oxide regions 22 on the isolations 10. A layer of palladium 23 having a thickness of approximately 15 nm will produce palladium silicide 24 having a thickness of approximately 33 nm. Note that the sidewall spacers 18 insulate the gate 4 from the palladium silicide 24.

Figure 1D:
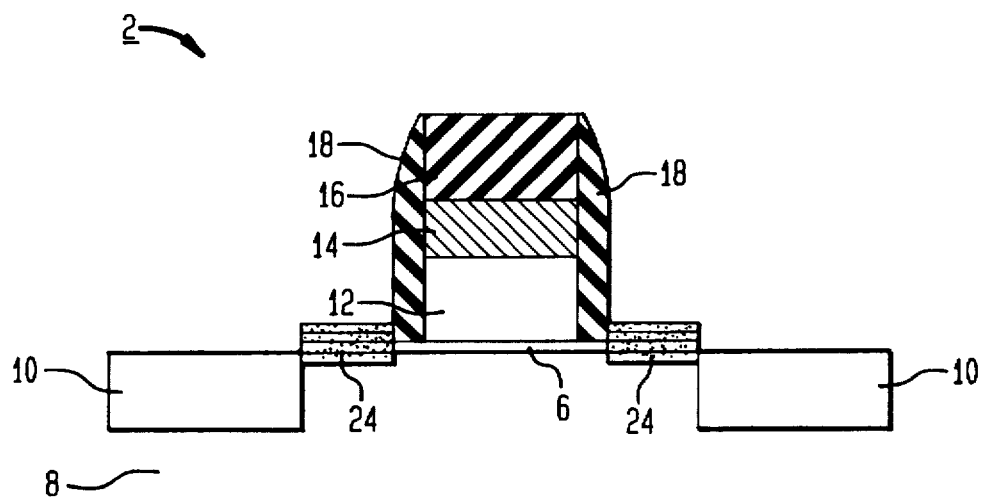

As shown in FIG. 1D, the unreacted palladium metal must then be stripped off of the sidewall spacers 18, capping layer 16 and field oxide regions 22, while retaining the palladium silicide 24. A wet etch comprising, for example, a 1:10:10 $HCl:HNO_3:CH_3COOH$ solution, provides the capability for such stripping. At an etch rate of approximately 100 nm/minute, etching for 40 seconds will adequately strip a 15 nm palladium film.

Figure 1E:
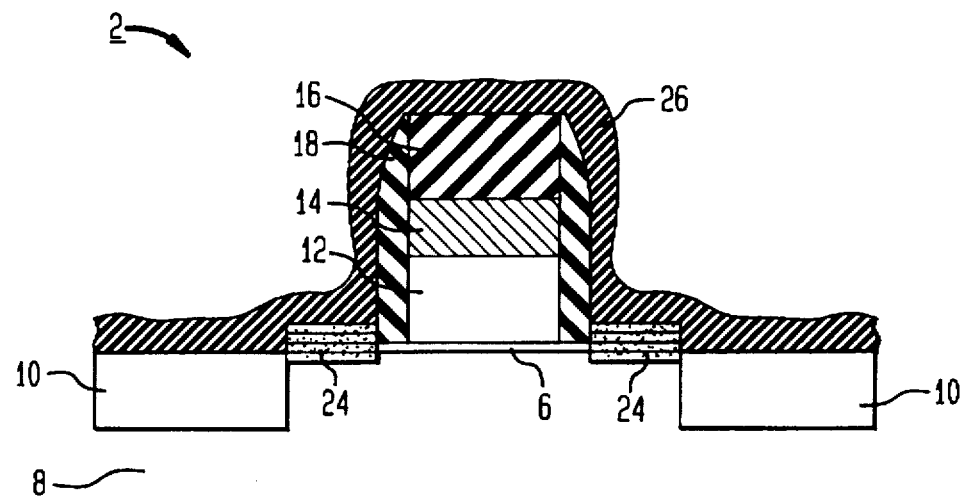

Referring now to FIG. 1E, a film or layer of amorphous or fine-grained silicon 26 is then deposited on the device 2 by, for example, sputtering. More specifically, the silicon layer 26 is deposited on the gate 4, sidewall spacers 18, palladium silicide 24 and isolations 10. Illustratively, the silicon layer 26 is deposited to a thickness approximately approximately 40 nm. Note that conformality of the silicon layer 26 is unimportant, since the silicon is needed only on the planar surfaces of the palladium silicide 24. As required and appropriate, the silicon layer 26 is then implanted with the proper dopant species. The proper dopant species depends on the polarity of the device 2. Advantageously, since the palladium silicide 24 possesses high nuclear stopping power, the palladium silicide 24 blocks the implanted species from being introduced into the substrate 8. The thickness of the silicon and the implant energy can both be optimized to the particular design of the device.

Figure 1F:
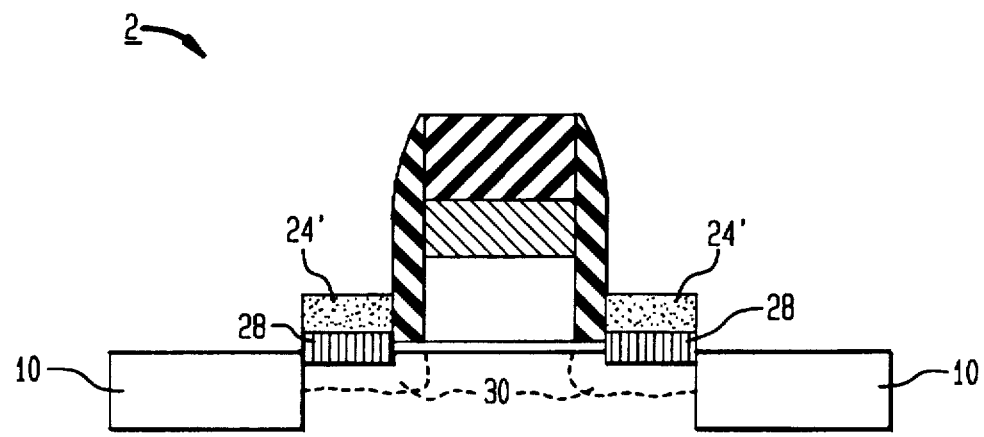

The device 2 is then annealed at a temperature of, for example, approximately 600° C. At such a temperature, the palladium silicide 24 acts as a transport media for the solid phase epitaxy of the sputter deposited silicon 26. The amorphous, unseeded silicon layer 26 is transported through the palladium silicide 24 and epitaxially recrystallizes on the active silicon junction surfaces 20 to form doped epitaxial silicon regions 28, as shown in FIG. 1F. The palladium silicide/silicon substrate interface functions as a template for recrystallization of the silicon, and thus the doped epitaxial silicon regions 28 form at the locations where the palladium silicide 24 was situated prior to the transport and recrystallization. These doped epitaxial silicon regions 28 are the raised source and drain regions of the device 2. Note that the sidewall spacers 18 insulate the gate 4 from the epitaxial silicon regions 28. The palladium silicide 24 formerly below the deposited silicon layer 26 is lifted or relocated to the surface, above the doped epitaxial silicon regions 28 via solid phase epitaxy, and emerges as low resistance palladium silicide contacts 24' to the epitaxial silicon regions 28. See, for example, Poate, Tu, Mayer, "Thin Films—Interdiffusion and Reactions", Wiley and Sons, New York (1978), pp. 450–460; J. Electrochem. Soc.: Solid-State Science and Technology, Vol. 122, No. 12, "Kinetics of the Initial Stage of Si Transport Through Pd-Silicide for Epitaxial Growth" by Z. L. Liau, et al., pp. 1696–1700; Journal of Applied Physics,. Vol. 46, No. 7, Jul. 1975, "Solid-Phase Epitaxial Growth of Si Through Palladium Silicide Layers" by C. Canali, et al., pp. 2831–2836; and Applied Physics Letters, Vol. 28, No. 3, 1 Feb. 1976, "Antimony Doping of Si Layers Grown by Solid-Phase Epitaxy" by S. S. Lau, et al., pp. 148–150.

As indication that palladium silicide provides for low resistance contacts, bulk resistivity of palladium silicide has been measured to be approximately 25–28 microohms-cm; and for a 100 nm palladium silicide film, the sheet resistance has been measured to be approximately 2.5 ohms/square.

Such formation by solid phase epitaxy provides for a self-aligned fabrication process for the palladium silicide contacts 24', and also provides for atomically clean silicide/silicon and recrystallized silicon/silicon substrate interfaces.

Advantageously, the palladium silicide contacts 24 reduce RC delay time. For example, a palladium silicide contact having a thickness of 33 nm will have a sheet resistance of approximately 6 ohms/sq.

Further, such palladium silicide contacts 24' reduce the contact resistance between the contacting silicide and the junctions. In this regard, ideally, a contact to a p-n junction or bipolar transistor should impose no barrier to the flow of charge carriers. Such an ohmic contact offers negligible resistance to current flow compared to the bulk. Metal silicide films deposited on semiconductors produce nonohmic, rectifying, contacts. The contact resistance, $R_c$, for such a metal/semiconductor system is orders of magnitude too large for integrated circuit applications. Instead of utilizing a contact where current transport is determined by thermionic emission over the Schottky energy barrier, a metal silicide in contact with a heavily doped semiconductor shows ohmic behavior determined by tunneling through the energy barrier. This process of forming a palladium silicide layer on a degenerately, i.e., highly, doped layer produces ohmic contacts with contact resistance, $R_c$, values on the order of 1E-6 ohm-cm2, and as such are ideally suited for ULSI geometries.

At the low annealing temperature of approximately 600° C., the dopants are redistributed into the recrystallized silicon regions 28, and thus the recrystallized silicon regions 28 function as concentration reservoirs for the dopants.

The remaining silicon on the sidewall spacers 18, gate insulating cap 16 and field oxide regions 22 is then removed, for example, by conventional reactive ion etching.

The dopant profiles are now poised for a high temperature diffusion process, such as furnace annealing at approximately 850° C. for about 10 minutes. Such a high temperature diffusion process will cause the outdiffusion of dopants from the doped epitaxial silicon regions 28 into the substrate silicon 8 so as to form shallow outdiffused junctions 30. The sidewall spacers 18 should be of a thickness which is sufficiently thin to allow dopants associated with the junctions to advance a sufficient distance laterally so as to provide an electrical connection between the junctions and the transistor channel region, while still maintaining the shallow junction requirements. Thus, the sidewall spacers 18 define the diffusion distance under the gate 4. Advantageously, such a diffusion process will not introduce crystal defects, which would otherwise be expected from an ion implantation process.

Those skilled in the art will appreciate that the present invention is broadly applicable to any semiconductor device in which it is necessary to provide a silicided contact on epitaxially recrystallized silicon regions.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A semiconductor device, comprising:

a silicon substrate;

a gate formed on said substrate, said gate having first and second sidewalls;

first and second sidewall spacers formed on said first and second sidewalls of said gate wherein said first and second sidewall spacers comprise silicon nitride;

first and second palladium silicide contacts, said first and second sidewall spacers insulating said gate from said first and second palladium silicide contacts;

a single raised source structure partially above and partially below said substrate, under said first palladium contact, said first sidewall spacer insulating said gate from said source structure; and a single raised drain structure partially above and partially below said substrate, under said second palladium contact, said second sidewall spacer insulating said gate from said drain structure.

2. A semiconductor device according to claim 1, wherein said gate comprises a gate insulating film, a polysilicon layer formed on said gate insulating film, a silicide layer formed on said polysilicon layer, and an insulating layer formed on said silicide layer.

3. A semiconductor device according to claim 2, wherein said gate insulating film has a thickness of approximately 5 nm, said silicide layer has a thickness of approximately 150 nm, and said insulating layer has a thickness of approximately 200 nm.

4. A semiconductor device according to claim 1, wherein said first and second sidewall spacers each have a thickness of approximately 20–30 nm.

5. A semiconductor device according to claim 1, wherein said first and second palladium silicide contacts each have a thickness of approximately 33 nm.

6. A semiconductor device according to claim 1, wherein said first and second palladium silicide contacts are each formed by a self-aligning process.

7. A semiconductor device according to claim 1, wherein:

said first and second palladium silicide contacts are formed by reacting palladium with portions of said silicon substrate;

said single raised source structure is formed by transporting doped silicon through said first palladium silicide contact such that said first palladium silicide contact is lifted above said source structure; and said single raised drain structure is formed by transporting doped silicon through said second palladium silicide contact, such that said second palladium silicide contact is lifted above said drain structure.

8. A semiconductor device according to claim 7, wherein said gate comprises a gate insulating film, a polysilicon layer formed on said gate insulating film, a silicide layer formed on said polysilicon layer, and an insulating layer formed on said silicide layer.

9. A semiconductor device according to claim 8, wherein said gate insulating film has a thickness of approximately 5 nm, said silicide layer has a thickness of approximately 150 nm, and said insulating layer has a thickness of approximately 200 nm.

10. A semiconductor device according to claim 7, wherein said first and second sidewall spacers each have a thickness of approximately 20–30 nm.

11. A semiconductor device according to claim 7, wherein said first and second palladium silicide contacts each have a thickness of approximately 33 nm.

12. A semiconductor device according to claim 7, wherein said first and second palladium silicide contacts are each formed by a self-aligning process.

13. A semiconductor device according to claim 1, wherein:

said first and second palladium silicide contacts are formed by reacting palladium with portions of said silicon substrate;

said single raised source structure is formed by transporting doped silicon through said first palladium silicide contact such that said first palladium silicide contact is lifted above said source structure; and said single raised drain structure is formed by transporting doped silicon through said second palladium silicide contact, such that said second palladium silicide contact is lifted above said drain structure.

* * * * *